United States Patent [19]

Krisciunas et al.

[11] Patent Number: 5,446,917
[45] Date of Patent: Aug. 29, 1995

[54] PROGRAMMABLE LENGTH DECIMATION FILTER AS FOR SIGMA-DELTA MODULATORS

[75] Inventors: Joseph E. Krisciunas, Clifton Park, N.Y.; Steven L. Garverick, University Heights, Ohio; Donald T. McGrath, Scotia, N.Y.

[73] Assignee: General Electric Company, Schenectady, N.Y.

[21] Appl. No.: 25,456

[22] Filed: Mar. 3, 1993

[51] Int. Cl.[6] .............................................. G06F 15/31
[52] U.S. Cl. ................................. 395/800; 364/724.1; 364/947.1; 364/DIG. 2
[58] Field of Search ...................... 395/800; 364/724.1, 364/947.1, DIG. 2

[56] References Cited

U.S. PATENT DOCUMENTS

| | | | |
|---|---|---|---|
| 4,509,037 | 4/1985 | Harris | 341/143 |
| 4,547,726 | 10/1985 | Premerlani | 324/76.21 |
| 4,715,000 | 12/1987 | Premerlani | 364/484 |
| 4,723,216 | 2/1988 | Premerlani | 364/484 |
| 4,775,851 | 10/1988 | Borth | 341/155 |
| 4,893,264 | 1/1990 | Noll et al. | 364/724.1 |
| 4,896,156 | 1/1990 | Garverick | 341/143 |
| 4,951,052 | 8/1990 | Jacob et al. | 341/122 |
| 5,027,306 | 6/1991 | Dattorro et al. | 364/724.1 |
| 5,126,961 | 6/1992 | Garverick | 364/724.1 |
| 5,134,578 | 7/1992 | Garverick et al. | 364/752 |
| 5,181,033 | 1/1993 | Yassa et al. | 341/143 |

OTHER PUBLICATIONS

"A Use of Limit Cycle Oscillations to Obtain Robust Analog-to-Digital Converters," James C. Candy, IEEE Transactions on Communications, vol. COM-22, No. 3, pp. 298-305, Mar., 1974.
"A Programmable Mixed Signal ASIC for Power Management," D. McGrath, P. Jacob, H. Sailer, IEEE 1992 Custom Integrated Circuits Conference, pp. 19.4.1-19.4.3.
"Using Triangularly Weighted Interpolation to Get 13-Bit PCM from a Sigma≧Delta Modulator," James C. Candy, Y. C. Ching, D. S. Alexander, IEEE Transactions on Communications, pp. 1268-1275, Nov. 1976.
"A Programmable Mixed-Signal ASIC for Power Metering," S. L. Garverick, D. T. McGrath, R. D. Baertsch, K. Fujino, 1991 IEEE International Solid State Circuits Conference, Digest of Technical Papers, pp. 36-37.
"A Programmable Mixed-Signal ASIC for Power Metering," S. L. Garverick, K. Fujino, D. T. McGrath, R. D. Baertsch, IEEE Journal of Solid-State Circuits, vol. 26, No. 12, pp. 2008-2016, Dec. 1991.

Primary Examiner—Alyssa H. Bowler
Assistant Examiner—John Harrity
Attorney, Agent, or Firm—Enrique J. Mora; Marvin Snyder

[57] ABSTRACT

A programmable length decimation filter responsive to an externally derived stream of quantized electrical signals arriving at a predetermined rate comprises a counter, a resolution filter, and an accumulator. The resolution filter is responsive to the counter output signals, to an externally derived resolution select signal, and to the stream of quantized signals, and operates to mask selected quantized signals in order to provide resolution filter output signals to the accumulator on a plurality of resolution filter output ports. The resolution select signal allows for providing flexibility of operation regarding the tradeoff of the bandwidth of the decimation filter with its resolution capability.

17 Claims, 11 Drawing Sheets

PROGRAMMABLE LENGTH DECIMATION FILTER AS FOR SIGMA-DELTA MODULATORS

RELATED APPLICATIONS

This application is related to patent application Ser. No. 07/653,935, now U.S. Pat. No. 5,349,676, entitled "Data Acquisition Systems with Programmable Bit-Serial Digital Signal Processors", by Garverick et al., filed Feb. 11, 1991, patent application Ser. No. 07/728,408, now U.S. Pat. No. 5,301,121, entitled "Measuring Electrical Parameters of Power Line Operation, Using a Digital Computer", by Garverick et al., filed Jul. 11, 1991, and patent application Ser. No. 07/726,443 now U.S. Pat. No. 5,226,001, entitled "Plural-Channel Decimation Filter, as for Sigma-Delta Analog-to-Digital Converters," continuation-in-part of U.S. Pat. No. 5,126,961, entitled "Plural-Channel Decimation Filter, as for Sigma-Delta Analog-to-Digital Converters", by Garverick, issued Jun. 30, 1992, all assigned to the assignee of the present invention and herein incorporated by reference.

FIELD OF THE INVENTION

This invention relates to decimation filters, and more particularly, to decimation filters such as for use with sigma-delta modulators.

BACKGROUND OF THE INVENTION

Several conflicting objectives are present in the field of high performance data acquisition for electrical power measurement, metering, and management. The first objective is high data resolution. The availability of high resolution analog-to-digital conversion methods, such as with sigma-delta modulators, combined with the power of state of the art digital signal processors provides the capability to achieve significant levels of accuracy. Thus, complex signal processing may be performed on precise data using conventional signal processing architectures. However, a second objective is increased signal processing bandwidth. An inherent tension exists between these two objectives in that increasing bandwidth typically occurs at the expense of data resolution. Yet, a third objective is smaller integrated or electronic circuitry that requires less power to operate. A need thus exists for a device having the capability to balance high data resolution demands against large bandwidth demands, as desired for power measurement, metering, and management systems, while having the size and power requirements of a conventional electronic or integrated circuit component.

SUMMARY OF THE INVENTION

One object of the invention is to provide a decimation filter that may be implemented on a single monolithic electronic integrated circuit chip using conventional digital electronic circuitry.

Another object of the invention is to provide a decimation filter that is programmable to have the capability to trade off the desired bandwidth of the filter against the desired resolution of the data.

A third object of the invention is to provide a decimation filter specifically for use with a one-bit sigma-delta modulator.

Briefly, in accordance with one embodiment of the invention, a programmable length decimation filter responsive to an externally derived stream of quantized electrical signals arriving at a predetermined rate comprises a counter, a resolution filter, and an accumulator. The resolution filter is responsive to the counter output signals, to an externally derived resolution select signal, and to the stream of quantized signals, and is adapted to mask selected quantized signals and, thereby, provide resolution filter output signals to the accumulator on a plurality of resolution filter output ports.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof, may best be understood by reference to the following detailed description when read with the accompanying drawings in which:

DETAILED DESCRIPTION OF THE INVENTION

Conventional analog-to-digital conversion frequently involves use of oversampled analog-to-digital converters. One example of such an analog-to-digital converter is sigma-delta modulator 700, illustrated in FIG. 1. Systems in which analog-to-digital converters and sigma-delta modulators may prove useful are described in U.S. Pat. No. 5,181,033 entitled "Digital Filter for Filtering and Decimating Delta Sigma Modulator Output Signals," by Yassa et al., issued Jan. 19, 1993, U.S. Pat. No. 5,126,961, entitled "Plural-Channel Decimator Filter, as for Sigma-Delta Analog-to-Digital Converters," by Garverick, issued Jun. 30, 1992, U.S. Pat. No. 5,134,578, entitled "Digital Signal Processor for Selectively Performing Cordic, Division or Square-Rooting Procedures," by Garverick et al , issued Jul. 28, 1992, U.S. Pat. No. 4,951,052, entitled "Correction of Systematic Error in the Oversampled Analog-to-Digital Converters," by Jacob et al., issued Aug. 21, 1990, and U.S. Pat. No. 4,896,156, entitled "Switched-Capacitance Coupling Network for Differential-Input Amplifiers Not Requiring Balanced Input Signals," by Garverick, issued Jan. 23, 1990, all of the foregoing patents assigned to the assignee of the present invention and wherein incorporated by reference, and described in "A Programable Mixed Signal ASIC for Power Metering," by S. L. Garverick, K. Fujino, D. T. McGrath, and R. D. Baertsch, IEEE Journal of Solid State Circuits, Vol. 26, No. 12, December 1991, pp. 2008–16, and "A Programmable Mixed Signal ASIC for Power Management," by D. T. McGrath, P. Jacobs, and H. Sailer, IEEE 1992 Custom Integrated Circuits Conference, pp. 19.4.1–19.4.2, both of which are herein incorporated by reference.

Figure 1:
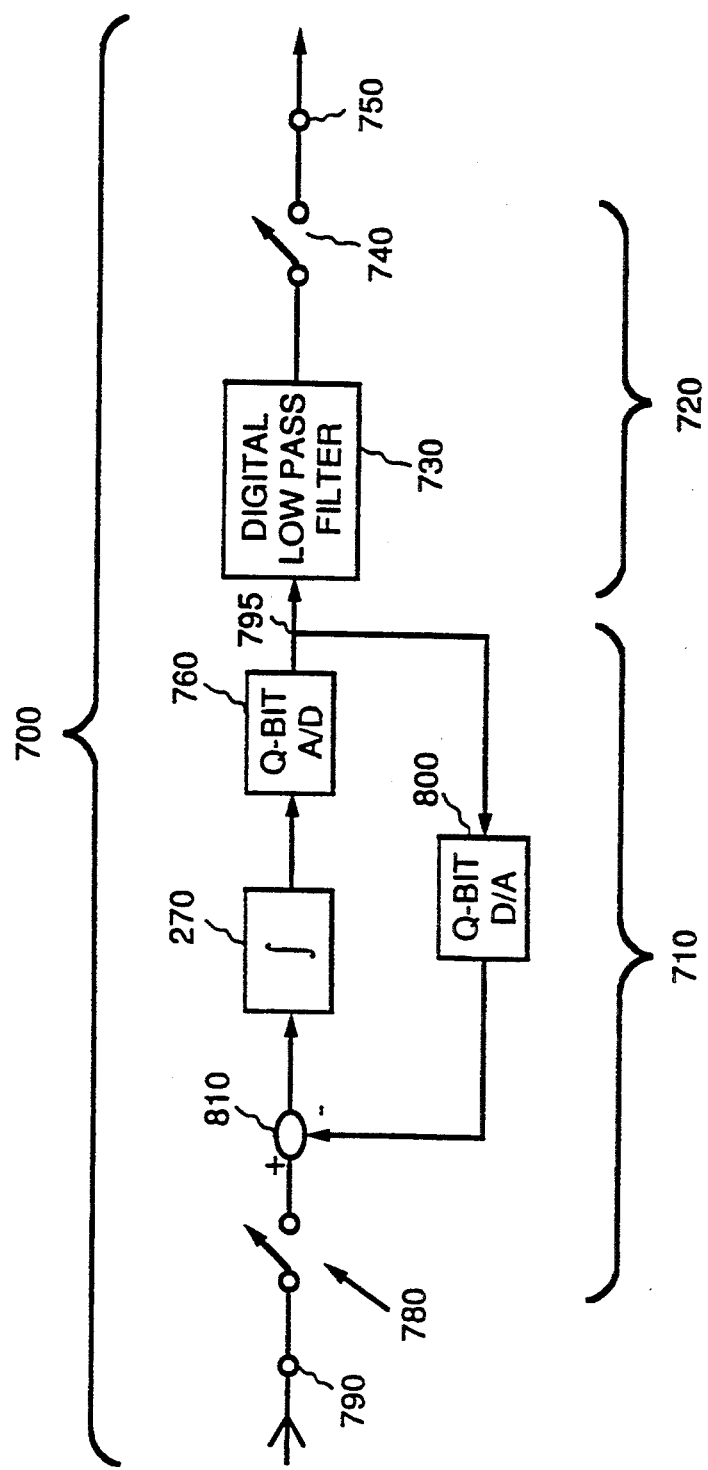
FIG. 1 is a block diagram of one embodiment of a sigma-delta modulator such as may be incorporated in an analog-to-digital converter having a programable decimation filter in accordance with the invention.

The technique of oversampling is frequently used in performing analog-to-digital conversion. An example of such a converter is illustrated in FIG. 1. In this illustration, converter 700 comprises a modulator 710 and a decimator 720. Modulator 710 produces coarse, or low-resolution, samples of its input signal, at a rate much greater than that required by the Nyquist theorem. These coarse samples are subsequently low-pass filtered by decimator 720 to produce high-resolution samples at or above the Nyquist rate of the input signal of the modulator.

As illustrated, modulator 710 comprises negative feedback to node 810, an integrator 270, a Q-bit analog-to-digital converter 760, and a Q-bit digital-to-analog converter 800. An analog input signal applied to terminal 790 is sampled at sampling device 780, illustrated by a switch, at a rate $f_{ds}$ much higher than the Nyquist rate. These samples are compared to a Q-bit estimate of the input signal provided by digital-to-analog converter 800, using the difference signal at node 810. The difference, or error signal, produced at 810 is integrated by integrator 270, then quantized by Q-bit analog-to-digital converter 760 to produce the Q-bit estimate of the input signal at terminal 795 which is supplied to the input port of digital-to-analog converter 800 and decimator 720. The combination of feedback and error-signal integration serves to shape the spectrum of the quantization noise such that it may be more completely removed by the low-pass filtering. The effectiveness of the noise shaping is improved when the number of integrators in the feedback loop increases, i.e., the order of the modulator, but serious stability problems are encountered for modulators of order greater than two.

As illustrated, the decimator comprises a digital low-pass filter 730 followed by signal sampling at 740 to provide a discrete output signal at a node or terminal 750. This filtering and decimation results in a large fraction of the quantization noise being removed to thereby provide a high resolution output signal. Nonetheless, it will be appreciated that the resolution is gained by having a throughput much lower than the initial sampling rate, $f_{ds}$. The ratio of the initial sampling irate to the final conversion rate is typically referred to as the oversampling ratio. As described in "A Comparison of Modulation Networks for High-Order Oversampled ΣΔ Analog-to-Digital Converters," *IEEE Transactions on Circuits and Systems*, Vol. 38, pp. 145–159, written by D. B. Ribner, published in February 1991, and herein incorporated by reference, the resolution (bits) of such an analog-to-digital conversion is governed by the number of quantization bits Q, the oversampling ratio R, and the order of the modulator, L, in accordance with the following expression:

$$\text{Bits} = (L + \tfrac{1}{2})\log_2 R - \log_2\left[\frac{\pi^L}{\sqrt{2L+1}}\right] + \log_2(2^{Q-1}) \quad [1]$$

This expression may be derived from a linear approximation to the modulator and by assuming an ideal low-pass filter. Equation [1] shows, in essence, that each time the oversampling ratio R is doubled, resolution is improved by $L+\tfrac{1}{2}$ bits.

Equation [1] may be evaluated for a first order modulator for various oversampling ratios. It will be appreciated that in accordance with equation [1] above, the higher the oversampling ratio the greater the corresponding number of bits, given a predetermined order for the sigma-delta modulator. For particular applications use of a one-bit quantizer may be desirable. One advantage of such a quantizer is that it may avoid harmonic distortion or other nonlinearities typically associated with multiple bit quantizers. In contrast with multiple bit quantizers, a one-bit quantizer is inherently linear because its output signal takes on one of two distinct values and, thus, determines a straight line. A sigma-delta modulator using a one-bit quantizer has been analyzed in "A Use of Limit Cycle Oscillations to Obtain Robust Analog-to-Digital Converters," *IEEE Transactions on Communications*, COM-22 (3), pp. 298–305, written by J. C. Candy, published in March, 1974, and herein incorporated by reference. Equation [2] below provides q(nτ), the nth quantized signal, where τ represents the cycle period:

$$q(n\tau) = \frac{1}{\tau}\int_0^{n\tau}[x(t) - q(t)]dt + \epsilon(n\tau) \quad [2]$$

The quantization represented by the addition of an error, $\epsilon$, is assumed to be uncorrelated to the input, x. Because q(t) is a sampled function, its integral may be expressed as a summation, which may be rearranged and divided by R, the number of cycles in a sample time, providing equation [3] below.

$$\frac{1}{R}\sum_{n=0}^{R}q(n\tau) = \frac{1}{R\tau}\int_0^{R\tau}x(t)dt + \frac{\epsilon(R\tau)}{R} \quad [3]$$

Equation [3] indicates that the average quantization error will be R times smaller than the "coarse" quantizer error. Thus, high resolution may be obtained by repeated feedback with a sufficiently large R.

Figure 2:
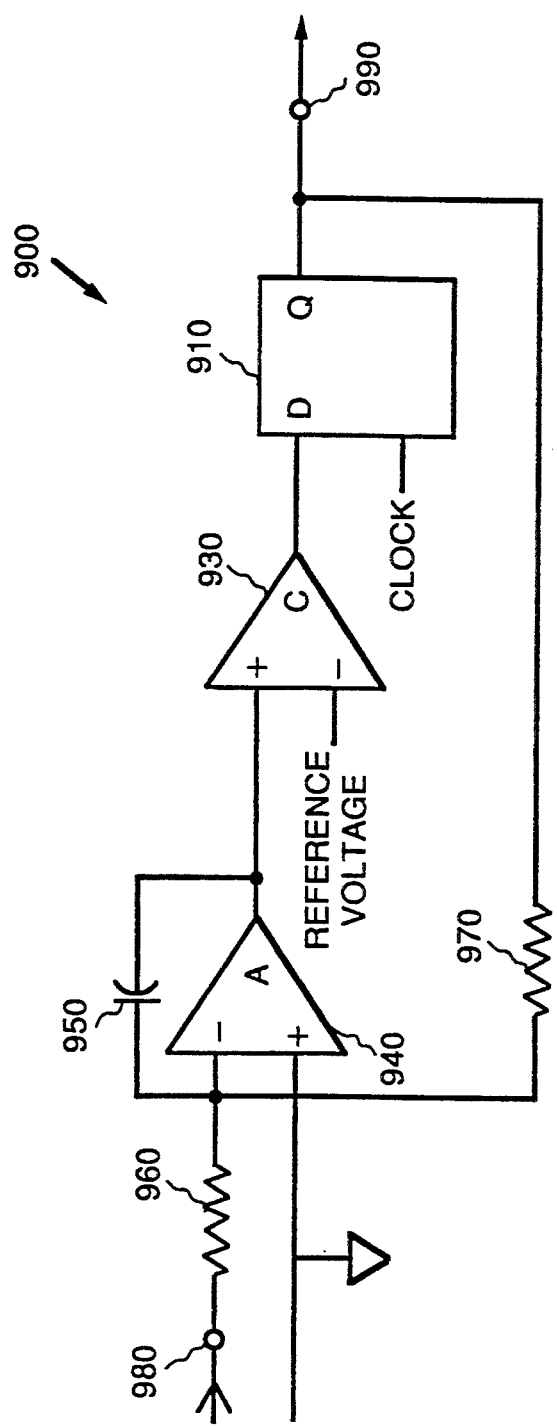
FIG. 2 illustrates an embodiment of a sigma-delta modulator, comprising electrical or electronic components, such as may be incorporated in an analog-to-digital converter having a programmable decimation filter accordance with the invention.

FIG. 2 illustrates one embodiment of the first order sigma-delta modulator for incorporation in an embodiment of an analog-to-digital converter having a decimation filter in accordance with the invention. As illustrated, the input signal, such as an electrical voltage, is provided at a terminal 980 and scaled or adjusted by a resistance 960. An amplifier 940 performs integration due to the presence of a capacitor 950 in a negative feedback configuration. Likewise, digital quantization is accomplished by coupling the output signal of amplifier 940 to the positive input terminal of a conventional comparator 930. As illustrated in FIG. 2, digital-to-analog conversion takes place because the output signal of comparator 930 is latched by a flip-flop 910 and subsequently provided to amplifier 940, as feedback, through a resistance 970. More specifically, one bit analog-to-digital conversion takes place due to the feedback provided through resistance 970 to integrating amplifier 940. This feedback through resistor 970 is equivalent to the feedback through digital-to-analog converter 800 in FIG. 1. The output signal at a node 990 of the modulator will have a spectral output corresponding to the shape illustrated in FIG. 3. Similar approaches have been employed, such as described in "A Seven-Channel Mixed Analog/Digital Signal Acquisition and Processing Architecture," a masters thesis for Rensselaer Polytechnic Institute, prepared by P. L. Jacob in December 1988, and herein incorporated by reference.

Figure 3:
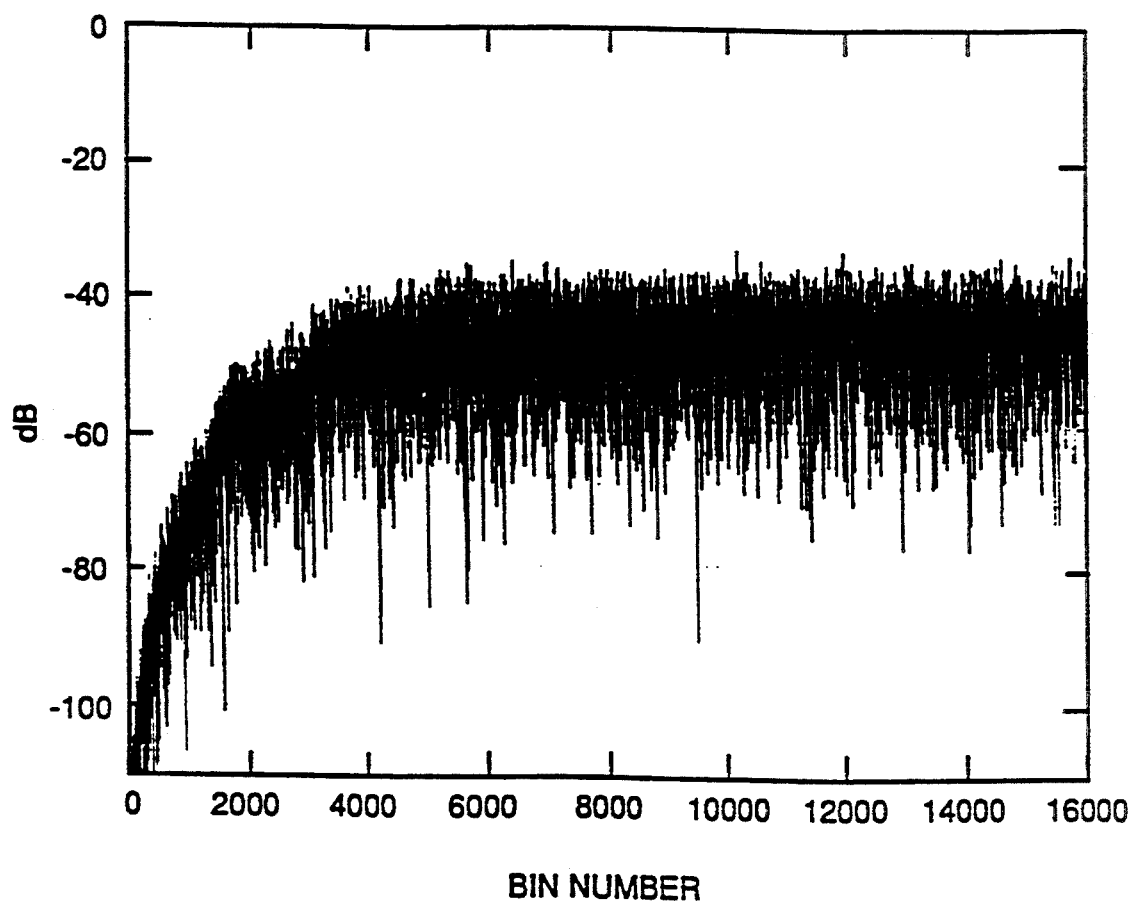
FIG. 3 shows spectral shaping of quantization noise such as may be accomplished by the use of sigma-delta modulator.

As previously discussed, an oversampling modulator shapes the spectrum of the quantization noise such that most of the noise energy is allocated to high frequencies. This is illustrated in FIG. 3, which shows a plot of the simulated quantization noise spectral density of a third-order, one-bit sigma-delta modulator; a first-order modulator is qualitatively similar. The highest frequency illustrated, bin number 16000, corresponds to $f_{ds}/2$. Since the decimator filters quantization noise energy between $f_{ds}/2R$ and $f_{ds}/2$, then reduces the sampling rate to $f_{ds}/R$, a trade-off exists between resolution and sampling rate which may be controlled by adjusting parameter R.

One embodiment of a decimation filter is a rectangular window filter. This conventional type of lowpass filter offers simplicity. Rectangular window filtering performed in the time domain has the frequency response of a sinc function. For a window of duration or length $\tau$, the frequency response is sinc ($f\tau$) with the first zero occurring at $f = 1/\tau$, where in the context of the invention sinc(x) refers to $[\sin(\pi x)]/\pi x$. The window length or duration $\tau$ is selected such that the first zero occurs at the conversion rate $f_{ds}/R$. Thus, $\tau = R/f_{ds}$. This filter has the desirable characteristic of linear phase. The various channels of a multi-channel system pass through the same linear phase decimation filter, and, thus, realize substantially the same time delay for the relevant range of input frequencies.

Figure 5:
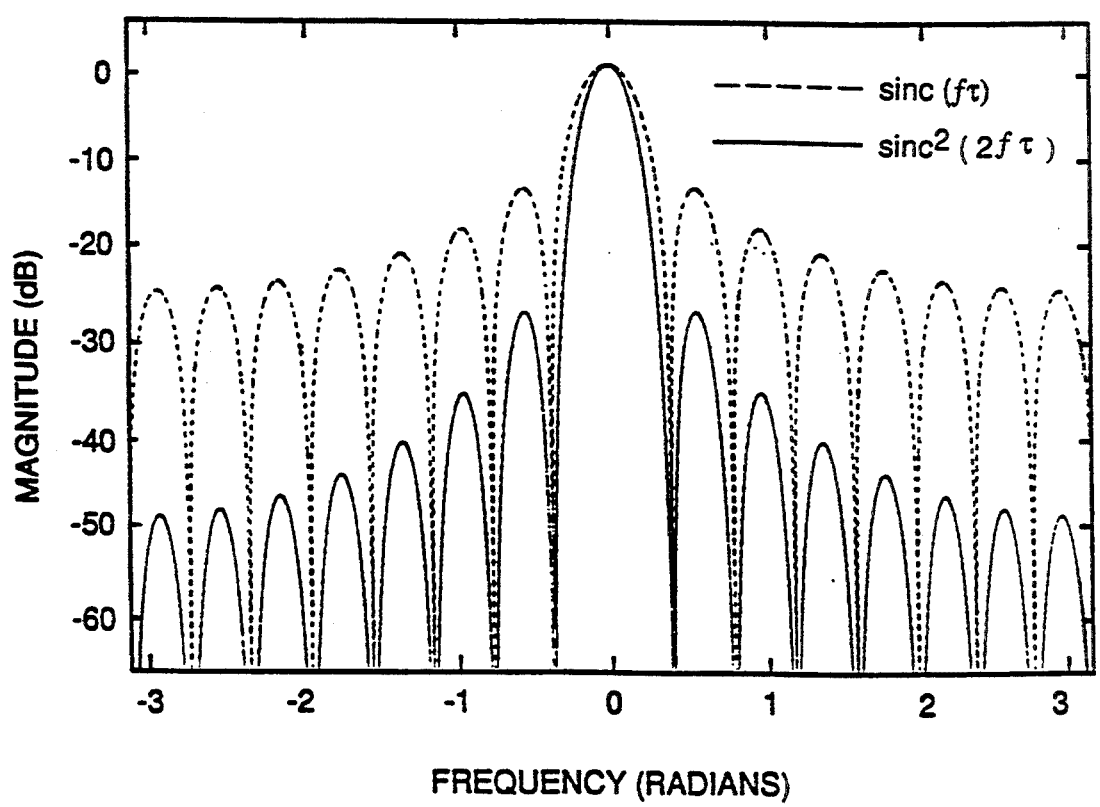
FIG. 5 shows, respectively, the frequency response for a rectangular "window" and a triangular "window" decimation filter.

Despite the simplicity of a rectangular window decimation filter, a "sharper" cutoff in the frequency domain may be achieved by using higher order filtering. One such embodiment is the so-called double interpolation filter in which the cutoff is sharper and stopband attenuation is increased in comparison with the rectangular window. One advantage of such a filter is that it reduces the amount of noise "leaking" through the stopband and, thus, aliased back into the baseband following decimation. One embodiment of a double interpolation filter is the triangular window, having a frequency response of $sinc^2$, such as described in the aforementioned Candy reference and in "Using Triangularly Weighted Interpolation to Get 13-Bit PCM from a Sigma-Delta Modulator," *IEEE Communications*, Com. 24, pp. 1268–1275, written by J. C. Candy, Y. C. Ching, and D. S. Alexander, published in November, 1976 and herein incorporated by reference. Thus, for a filter of length $\tau$, the frequency response is $sinc^2(f\cdot\tau/2)$ with the first zero at $f = 2/\tau$. It will now be appreciated that to maintain the first zero at the decimation frequency, the filter length for this particular embodiment becomes doubled. Thus, $\tau = 2R/f_{ds}$ places zero frequency response at the conversion rate $f_{ds}/R$. FIG. 5 illustrates the frequency response of a first order rectangular filter of length $\tau = 16$ and a second order triangular filter of length $2\tau = 32$, demonstrating that a sharper cutoff and improved stopband attenuation is achieved by the second order filter.

Figure 4A:
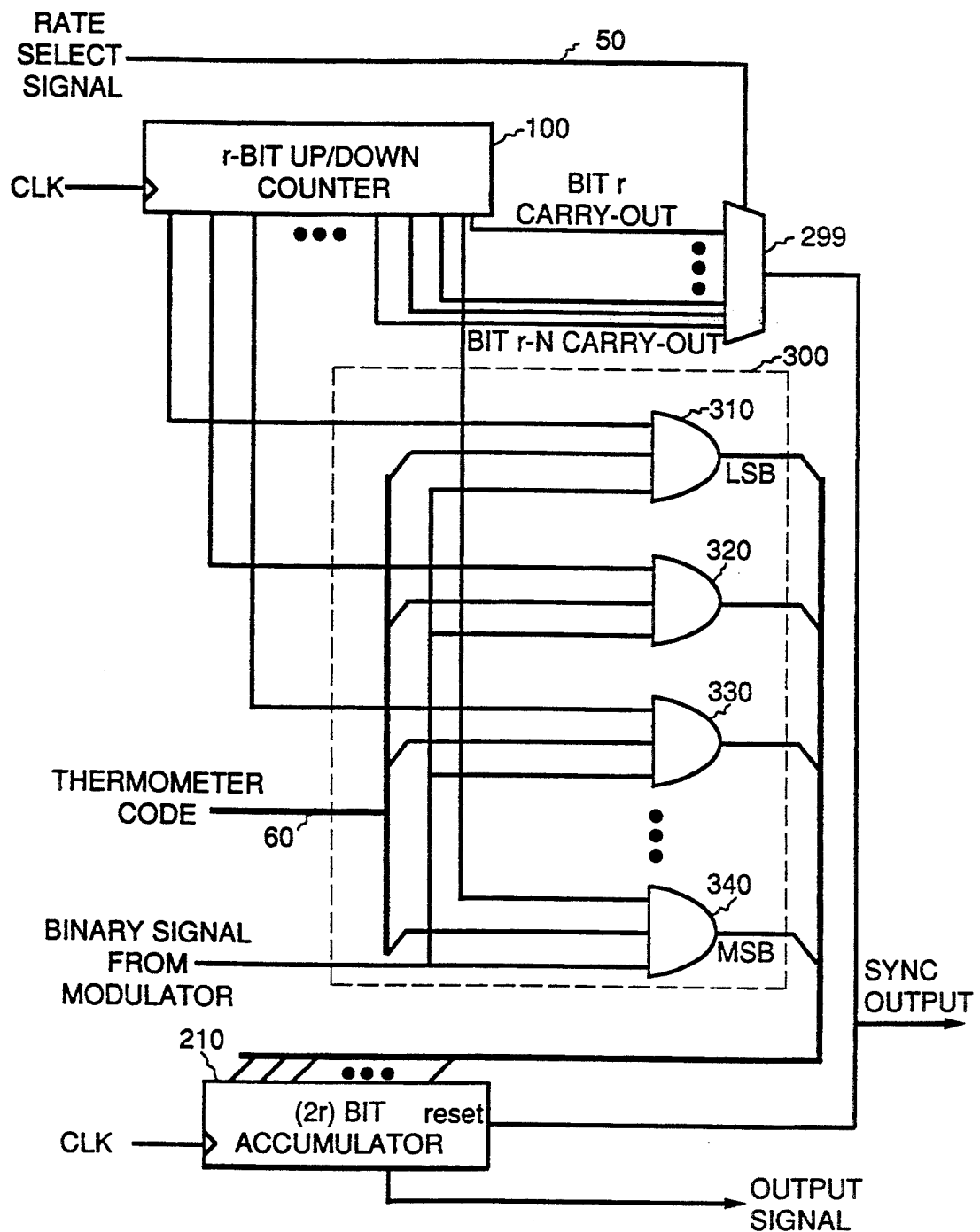
FIGS. 4a, 4b, and 4c schematic diagrams of alternative embodiments of a programmable decimation filter in accordance with the invention.

FIG. 4a illustrates one embodiment of a programmable decimation filter in accordance with the invention. Typically, a double interpolation filter is costly to implement in that the number of taps of the corresponding impulse response filter doubles as compared with a rectangular window filter and a weighted average of the output signals of the sigma-delta modulator is desired. As illustrated in FIG. 4, a generation of the triangular window weights may be accomplished by a binary counter 100 in response to a first externally derived clock pulse substantially corresponding to the predetermined rate of arrival of the stream of quantized electrical signals to be filtered. The convention of the embodiment illustrated is that "bit one" is the least significant bit and "bit r" is the most significant bit. It will be appreciated that the invention is not limited in scope to this convention. In the embodiment illustrated in FIG. 4a, counter 100 comprises an r-bit "up/down" counter. As illustrated, counter 100 includes a plurality of counter output ports each being adapted to provide a separate counter output signal. In this particular embodiment, the multiplication operation is implemented as a masking of the quantized signals, here triangular weights, with the modulator output signal and summation is performed by accumulator 210. It will be appreciated that in other embodiments in accordance with the invention in which bit serial processing or a single bit sigma-delta modulator is not employed, the processing may comprise a multiply and accumulate process rather than a mask and accumulate process. In the embodiment illustrated, $r = \log_2 R$, where R is the highest oversampling ratio. Thus, an r bit up/down binary counter may count from 0 to $2^r - 1$, then from $2^r$ to 1. Likewise, upon the counter reaching zero, the accumulated value may be provided as the decimation filter output signal and accumulator 210 may be reset for the next quantized sample, such as from a sigma-delta modulator.

The embodiment of the invention illustrated in FIG. 4a includes a resolution filter 300 responsive to the counter output signals, to a resolution select signal, and to the stream of quantized electrical signals provided by a modulator, such as a sigma-delta modulator. The resolution filter provides flexibility regarding the tradeoff of the bandwidth of the filter with its resolution capability. As illustrated in FIG. 4a, resolution filter 300 is adapted to mask the quantized signals and thereby provide resolution filter output signals on a plurality of filter output ports.

The flexibility to trade off bandwidth versus data resolution is provided by a resolution select signal coupled to resolution filter 300 through a port 60. This embodiment allows selection of one of N + 1 decimation ratios, the possible ratios corresponding from $2^r$ to $2^{r-N}$ inclusive. This provides programmability with r corresponding to the maximum desired decimation ratio. Thus, rates of $2^{r-n}$ where n is less than r are realizable simply by changing the rate select signal and corresponding thermometer code, as described hereinafter. The desired length of the filter is stored in "thermometer" code format, such as in an r-bit register (not shown). In the context of the invention, "thermometer code" representation or format refers to representing a value of n, where n is greater than zero, by binary $2^{(r-n)} - 1$. Thus, the value n is represented by placing a 1 in binary places one through r−n, and zero in binary places r−n+1 thru r. Zero is represented by all one bits. In this particular embodiment, the zeros occupy the most significant bit locations, although the scope of the invention is not limited to this convention. Thus, filter lengths of $2^{r-N}$ through $2^r$ may be achieved by masking the output signal or bits of the counter by this code and triggering the output signal of the decimation filter based on an output signal from a rate select 299, as described hereinafter.

As illustrated in FIG. 4a, rate select 299 has a plurality of input ports coupled to selected output ports of counter 100, a control port 50 receiving a rate select signal to select the rate at which to provide a decimation filter output signal, and a rate select output port. As illustrated in this embodiment, rate select 299 comprises an (N+1) to 1 multiplexer in which the rate select signal determines which counter output signal to provide to the output port of the (N+1) to 1 multiplexer. In the context of the invention, the term "multiplexer" refers to a device or combination of devices, such as digital electronic gates or other circuitry, for selecting one signal from a plurality of signals in response to a control signal. The output signal provided at the output port of the rate select 299 corresponds to the carry out signal from counter bit r−n. Combining the previously described rate select signal with a thermometer code in which bits r−n through bit r are masked, as previously described, provides decimation filtering at a ratio of $2^{r-n}$.

Figure 4B:
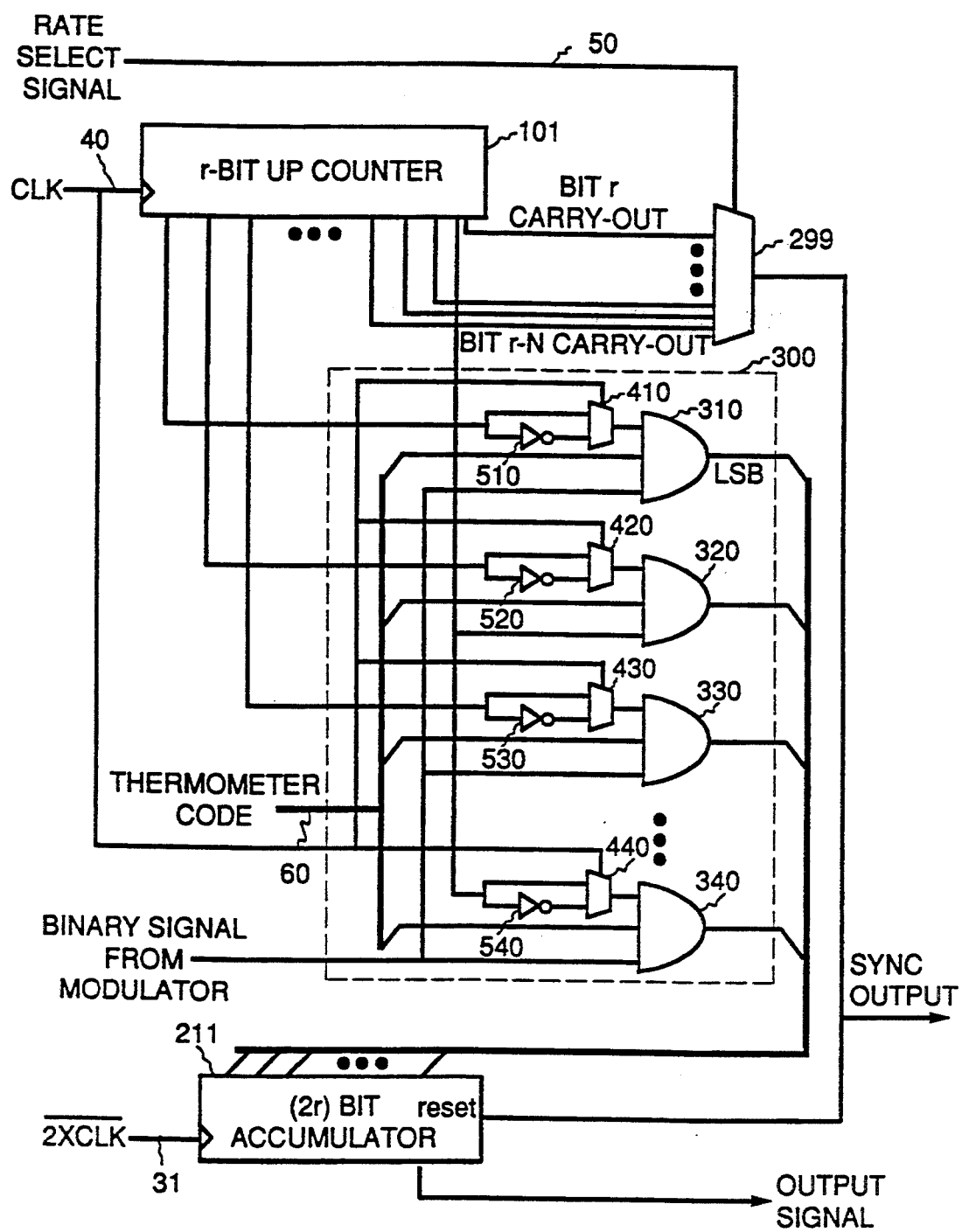

Whereas a combination of a counter and accumulator would provide filtered data, such as just described, at a conversion rate of $f_{ds}/2R$, this rate may be doubled, as illustrated in FIG. 4b. In this particular embodiment an accumulator 211 is responsive to a second externally derived clock pulse received at a port 31 substantially corresponding to twice the predetermined arrival rate Of the quantized signals. Likewise, for proper synchronization the complement of the signals provided is employed.

Figure 6:
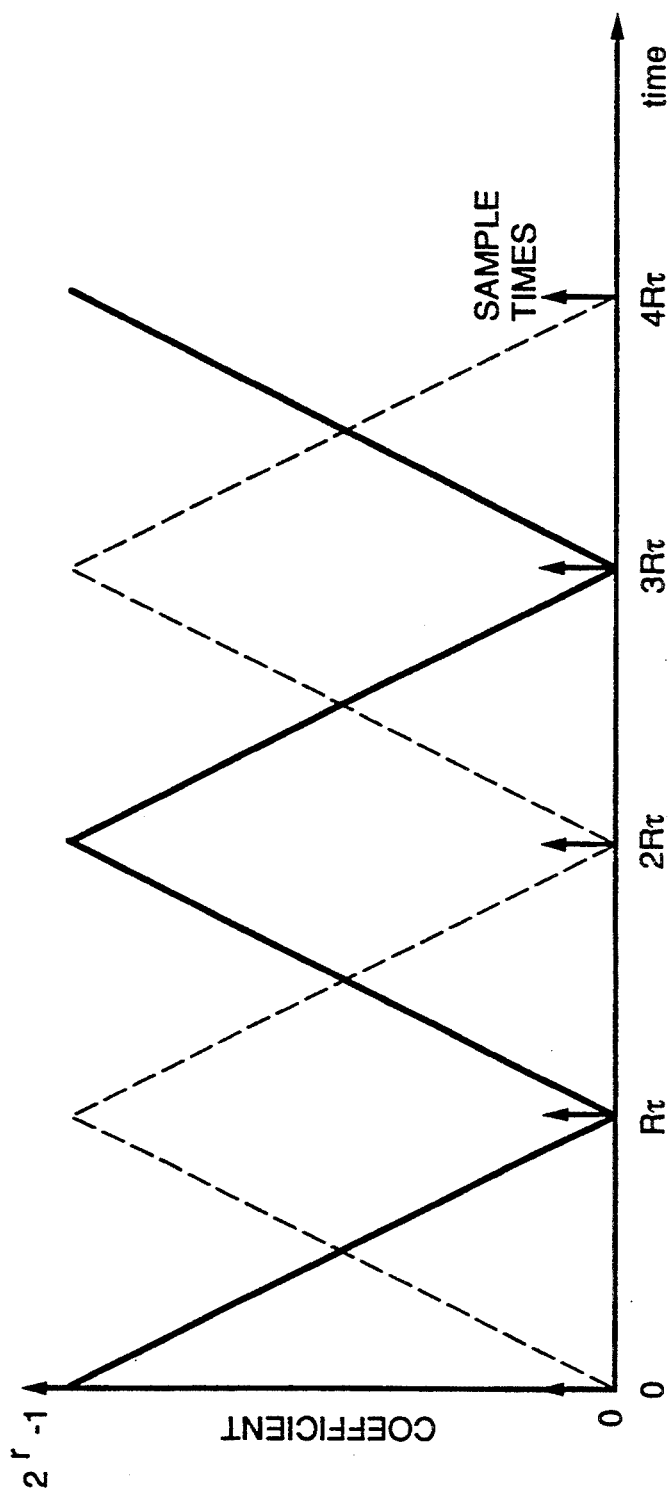
FIG. 6 shows a plot of the filter coefficient such as may be realized by an embodiment of a programmable decimation filter in accordance with the invention.

FIG. 4b illustrates a plurality of two-to-one multiplexers, such as multiplexers 410, 420, 430, and 440, within resolution filter 300, each coupled to obtain a counter output signal and the complement of that signal through a signal inverter. It will be appreciated by those skilled in the art that multiplexers may be included in the programmable decimation filter outside the embodiment of filter 300 or, alternatively, multiplexers need not be included in an embodiment of a programmable decimation filter in accordance with the invention at all, such as in FIG. 4a. However, this feature of the embodiment illustrated in FIG. 4b in conjunction with accumulator 211 takes advantage of the fact that the down ramp of a triangular filter is simply the inverse of the up ramp, as illustrated in FIG. 6. Thus, the output signals of counter 101, which constitutes an up counter, may be complemented as a counter 101 counts up to thereby produce a corresponding down count. This is accomplished in the embodiment of FIG. 4b by each two-to-one multiplexer, such as multiplixer 410, having two input ports, one, output port and a control signal port. Likewise, both input ports of each separate multiplexer are electrically coupled to a separate respective output port of the counter; however, for each multiplexer 410, 420, 430 and 440 one of the two input ports is coupled through a conventional signal inverter, such as inverter 510, 520, 530, and 540, respectively.

In accordance wieh this embodiment of the invention, decimation filter signal outputs may be produced by multiplying or masking each modulator signal output with the coefficient, or counter signal outputs, provided by counter 101 and the complement of that coefficient. FIG. 6, illustrates the time domain representation of the coefficients employed in the processing performed by the programmable decimator filter. Multiplication of the quantized electrical signal by the coefficient is performed for the up count of counter 101 by a series of at least r logical AND gates, such as AND gates 310, 320, 330 and 340, masking the output signals from counter 101, with the sigma-delta modulator outpue signal and the resolution select signal provided in thermometer code format. Each AND gate of the resolution filter has a first, second, and third input port and an output port. The second input port of each AND gate receives the resolution select signal provided by coupling 60, the first input port is coupled to a separate counter output port, and the third input port is coupled to the modulator output port. It now will be appreciated that the input and output ports of the AND gates constitute the input and output ports of the resolution filter. The results from the output ports of the AND gates are summed in a 2r bit binary accumulator, such as accumulator 211. On the same clock cycle of counter 101 but the next cycle for the accumulator, the counter output signals or coefficient bits are inverted, such as by inverter 510 coupled to multiplexer 410, and the corresponding accumulation is performed for the down ramp. After a complete cycle of R clocks by counter 101, the decimation filter signal output is triggered based upon a counter output signal from counter 101 provided through rate select 299, as previously described. The output signal is the sum stored in accumulator 211. It will now be appreciated that for the embodiment of the decimation filter illustrated in FIG. 4b, consecutive "windows" overlap, resulting in the first zero of the triangular window filter occuring at the decimation frequency $f_s/R$. Decimation filter output samples or signals may be latched by the embodiment illustrated in FIG. 4b at the times indicated by the arrows in FIG. 6.

As will be appreciated by those skilled in the art, a required decimation ratio may be determined based upon the desired bandwidth, assuming that a triangular "window" decimation filter embodiment is desirable. Typically, the decimation occurs at the frequency of the first zero of the filter. Values of r may include 9, and values of n may include 0, 1, 2, 3 and 4, where the relevant range of oversampling ratios is chosen based on a desired bandwidth for signal acquisition. Although this particular embodiment of the invention implements a triangular filter, it will be appreciated that a rectangular filter may likewise be implemented.

Figure 4C:
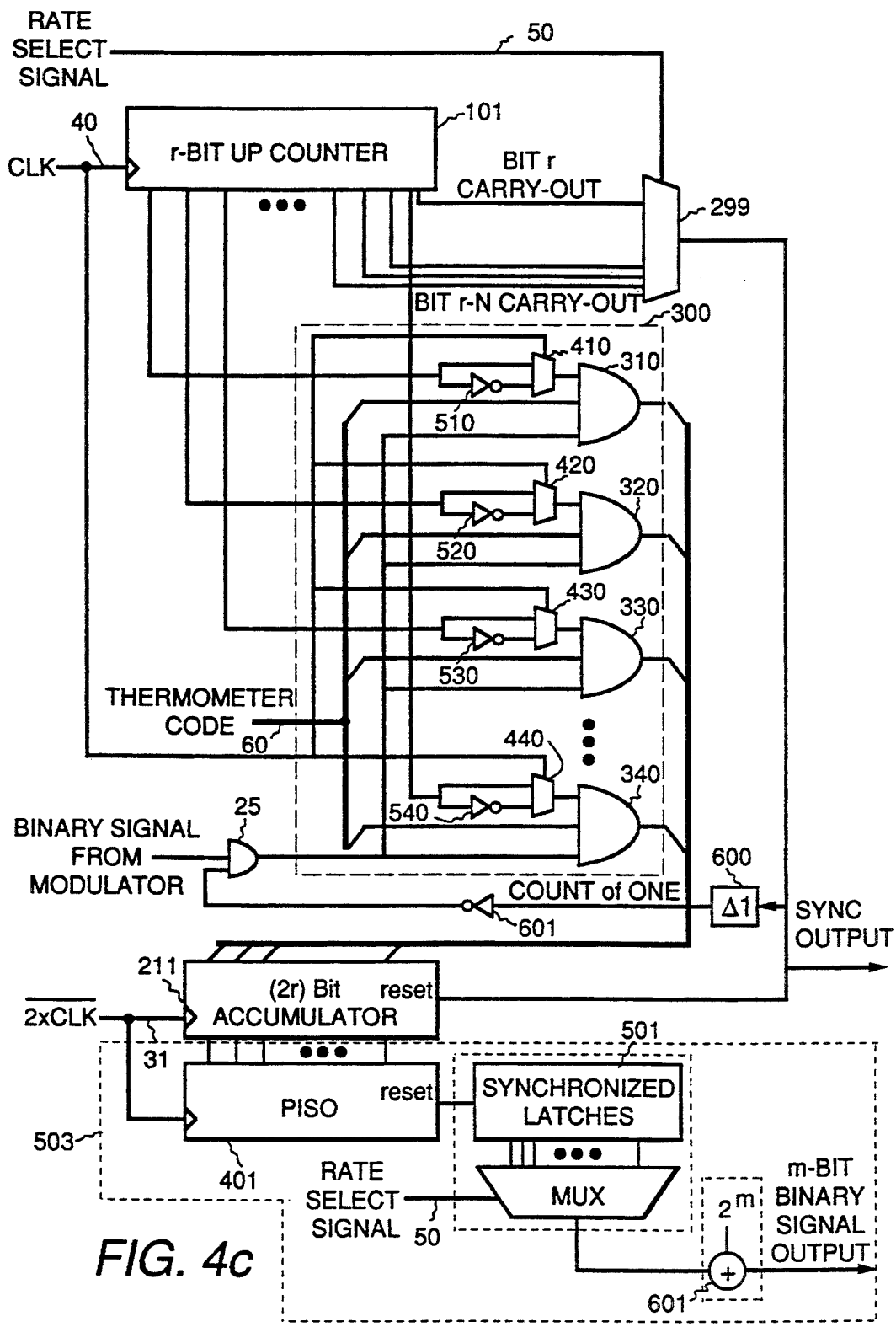

The embodiment illustrated in FIG. 4c addresses the situation where the output signal provided by the sigma-delta modulator is consistently at full scale. In this situation, the decimation filter output signal should be $2^{2r}$, which equals the sum of all the coefficients of the decimation filter, as illustrated by equation [4]:

$$\text{Output Signal} = \sum_{n=0}^{2^r-1} n + \sum_{n=1}^{2^r} n = 2^{2r} = R^2 \qquad [4]$$

Nonetheless, since this particular embodiment of the invention employs only 2r-bit arithmetic, a full scale input signal would "wrap around" to a zero output signal. One technique for avoiding such "wrap around" may include using an (2r+1) bit accumulator; however, this would require additional complex or expensive circuitry. The embodiment illustrated in FIG. 4c avoids this accumulator overflow by masking the output signal of the sigma-delta modulator during the second up count following a reset of the accumulator with a time delay 600, as illustrated in FIG. 4c. As illustrated, time delay 600 is coupled to the output port of rate select 299 and then complemented by an inverter 601.

Figure 7A:
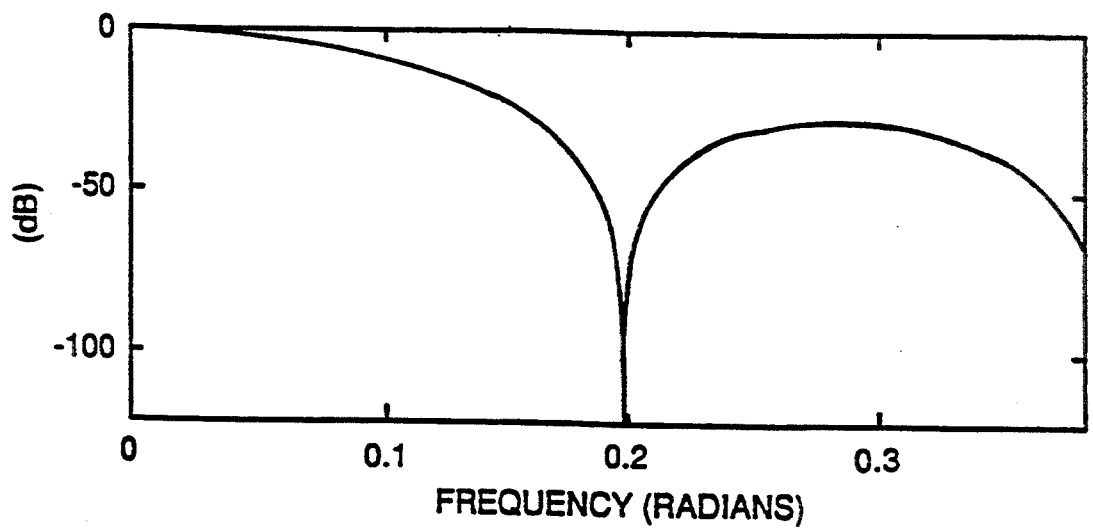
FIGS. 7a and 8a, illustrate, respectively, the ideal frequency response for two decimation filters.
Figure 7B:
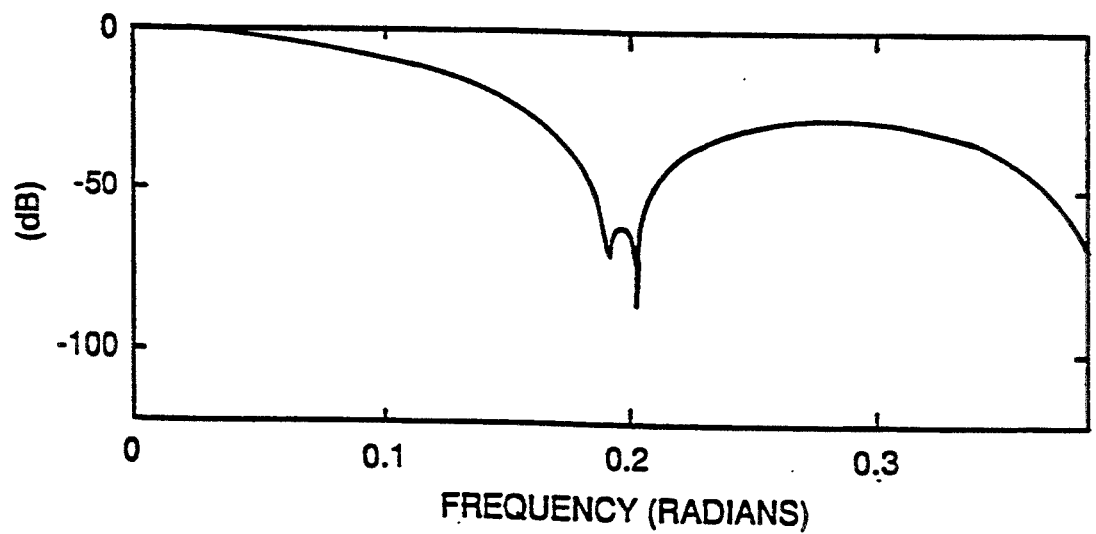
FIGS. 7b and 8b illustrate, respectively, the frequency response of those filters realized by an embodiment of a programmable decimation filter in accordance with the invention such as illustrated in FIG. 4c.
Figure 8A:
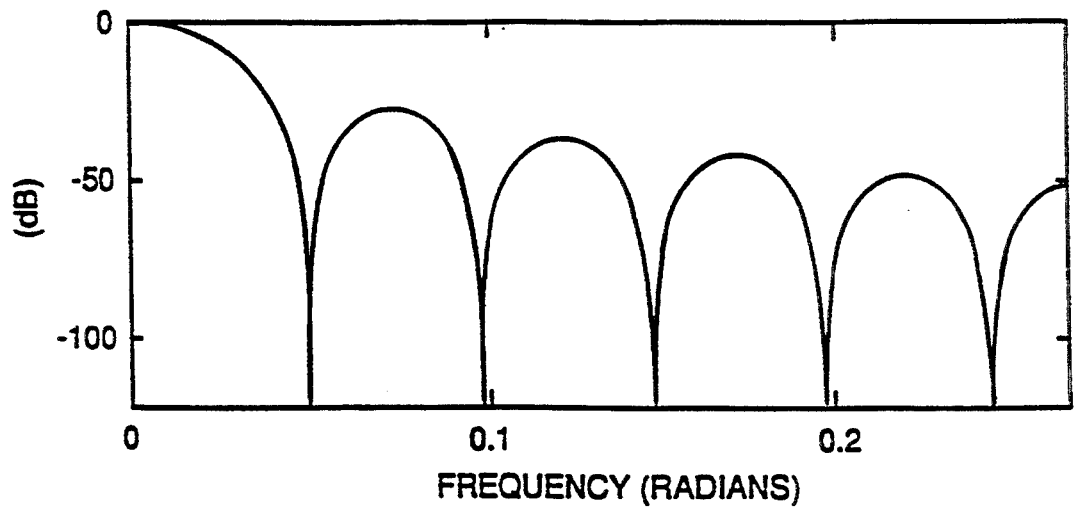
Figure 8B:
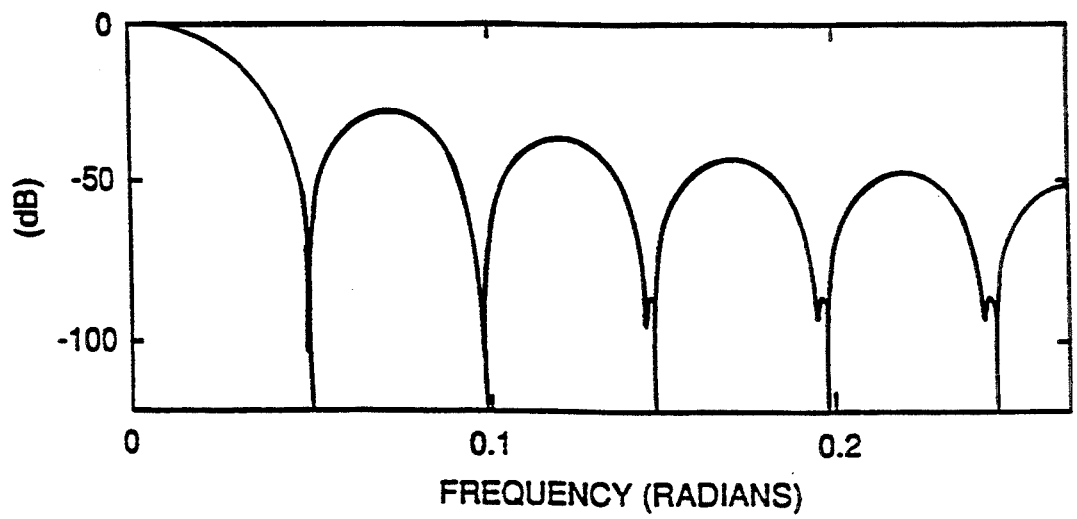

Time delay 600 may be realized by a number of possible embodiments, including a latch of the accumulator reset signal. Such a latch may comprise a conventional flip-flop. Thus, as illustrated in FIG. 4c, on the accumulator clock pulse following the accumulator reset, due to coupling between time delay 600 and an AND gate 25, an input signal would no longer appear at one input port of AND gate 25 with another input port of AND gate 25 being coupled to the sigma-delta modulator output terminal or port providing the modulator output signal. In the embodiment in FIG. 4c the accumulator reset signal comprises a counter up clock pulse. Where the reset signal constitutes only a down clock pulse or an up/down clock pulse, additional digital circuitry may also couple the externally derived clock pulse at port 30 to AND gate 25 for synchronization. As illustrated, the inverted time delay masks the modulator output signal because AND gate 25 couples the modulator output port to the third input port for each AND gate in resolution filter 300. This has the effect of reducing the sum of the full scale output count by one, resulting in a full scale reading for a full scale input signal from the modulator. This modification to the triangular "window" coefficients results in a slight alternation in the magnitude response of the decimation filter realization. The frequency response of the resulting modified triangular window filter is shown in FIGS. 7b and 8b along with the corresponding response for the ideal triangular window filter for r−n equal 5 and 7 in FIGS. 7a and 8a, respectively.

FIG. 4c also illustrates circuitry coupled to the output ports of the accumulator for performing normalization of the filter output and transformation to signed "twos complement" form. In these embodiments, accumulator 211 accumulates the output signals of filter 300 in "unsigned binary" form. As illustrated, the accumulator output signal is provided to a conventional parallel-to-serial converter or interface 401. Parallel-to-serial converter (PISO) 401 provides serial electrical signals or bits to a tapped delay 501. The tapped delay normalizes the decimation filter output signal in response to the rate select signal applied to rate select control port 50. Normalization is desirable because depending on the rate selected, the output signal of the filter will be provided in binary multiples for the same modulator input signals. The tapped delay may comprise a series or string of coupled latches properly synchronized and a conventional multiplexer responsive thereto. Thus, the tapped delay shifts the binary output signals depending on the rate select signal, thereby providing the desired normalization. Next, the shifted output signals are converted to signed twos complement by adding 1 in the appropriate binary position depending on the number of bits in the output signal and truncating the result. It will be appreciated by one skilled in the art that this is equivalent to inverting the bits or binary signals and adding one. It will now be appreciated that this normalization and twos complement transformation or conversion is performed continually; however, after the cycle is complete, a signal from rate select 299 triggers the output port of the decimation filter to provide a decimation filter output synchronization signal. The normalization and twos complement transformation may be realized with any one of a number of embodiments depending upon the particular use of the programmable decimation filter. For example, the accumulator may be coupled to a microprocessor 503, illustrated in FIG. 4c by dashed lines, or to other analog or digital circuitry, not shown. Likewise, normalization may alternatively be accomplished by delaying the synchronization signal and the conversion signal to signed twos complement, rather than by delaying the accumulator output signal.

Figure 9:
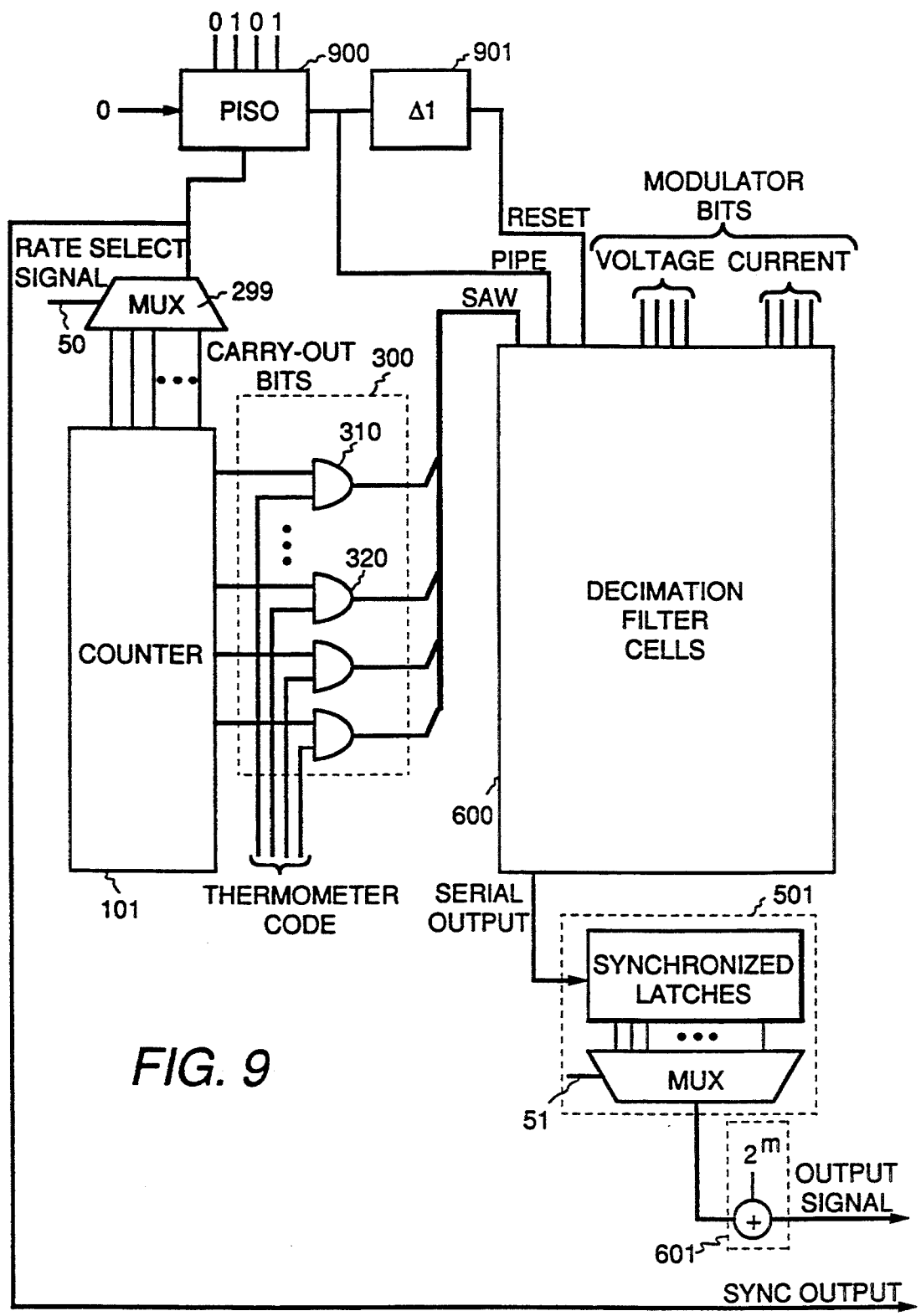
FIG. 9 is a schematic diagram of yet another alternative embodiment of a programmable decimation filter in accordance with the invention.

FIG. 9 illustrates yet another embodiment of a programmable decimation filter in accordance with the invention. The embodiment illustrated in FIG. 9 may be employed in conjunction with decimation filter cells 600, such as disclosed in aforesaid patent application Ser. No. 07/653,935 (RD-20,822) now U.S. Pat No. 5,349,676. The decimation filter shown in FIG. 9 includes decimation filter cells 600, i.e., as described and illustrated in FIG. 7 of aforesaid patent application Ser. No. 07/653,935 (RD-20,882) now U.S. Pat. No. 5,349 676, to provide eight channels of output signals. In this particular embodiment, four such cells (not shown) are coupled to provide eight channels, whereas three cells are coupled together in the 1 aforesaid patent application to provide six such channels. Otherwise, the embodiment of the invention illustrated operates in the manner previously described.

As illustrated, the counter output signals are masked by the resolution select signal in filter 300. Likewise, rate select signal at rate select control port 50 triggers the output signal of the programmable decimation filter and at control port 51 triggers the output signal of decimation filter cells 600 provided in unsigned binary for conversion to signed twos complement by twos complement converter 601, as previously described with respect to FIG. 4c. Likewise, the output signal of decimation filter cells 600 is provided in bit serial form so that no conversion from parallel-to serial is required; however, a tapped delay 501 is provided to normalize the decimation filter output signal, as previously described, based on the rate select signal. Input signals "saw", "pipe", and "reset" to decimation filter cells 600 constitute the coefficient signals provided by filter 300 and various reset signals for the implementation of the decimation cells as disclosed in aforesaid patent application Ser. No. 07/653,935 (RD-20,882) now U.S. Pat. No. 5,439,676. Input signals "pipe" and "reset" are provided by parallel-to-serial converter 900 and time delay 901. Likewise, eight modulator signals respectively provide voltage and current measurements.

Filtering a stream of externally derived digital signals with a programmable decimation filter in accordance with the invention may be accomplished by the following method. An externally derived stream of digital signals is received, such as by the embodiment of a programmable decimation filter illustrated in FIG. 4a. A predetermined resolution select signal is provided, such as to resolution filter 300. The generated sequence of consecutive binary numbers is generated, such as by counter 100. The received stream of digital signals is then masked with the predetermined sequence of binary signals and the provided resolution select signal, as previously described. Thus, each respective one of the digital signals in the received stream is masked with a respective one of the binary signals in the predetermined sequence and the provided resolution select signal. Finally, the masked signals are accumulated to provide the filtered signal. In accordance with the previous discussion, the resolution select signal may be provided in thermometer code format. Likewise, the previously described method may further include the steps of generating another predetermined sequence of consecutive binary signals by complementing the last mentioned sequence of binary signals and then masking the received stream of digital signals with this other predetermined sequence of binary signals and the resolution select signal. Likewise, as previously suggested, this stream of externally derived digital signals will typically comprise a single bit signal stream from a one-bit sigma-delta modulator and as previously described, overflow may be avoided in the previously described masking step by first masking the first binary signal of the predetermined sequence before masking the remaining signals in the sequence of generated signals.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A programmable length decimation filter responsive to an externally derived single bit stream of quantized electrical signals arriving from a one bit sigma-delta modulator at a predetermined rate, said filter comprising:
   an r bit binary counter, being adapted to respond to a first plurality of externally derived clock pulses corresponding to the predetermined rate, said counter including a plurality of output ports each being adapted to provide a separate counter output signal;
   a resolution filter comprising r logical AND gates, each of said AND gates having a first, a second, and a third input port and one output port, the input and output ports of said AND gates constituting the input and output ports of said resolution filter, respectively, the first input port of each AND gate being adapted to respond to the resolution select signal, the second input port of each AND gate being coupled to a separate counter output port, the third input port of each AND gate being adapted to respond to the single bit stream from said one-bit modulator; and
   a 2r bit binary accumulator, adapted to respond to the resolution filter output signals, including a plurality of input ports and an output port, separate ones of said accumulator input ports being coupled to separate ones of said resolution filter output ports, respectively, said accumulator being adapted to respond to a second plurality of externally derived clock pulses corresponding to twice the rate of the first plurality of externally derived clock pulses;
   wherein said second input port of each of said filter gates is coupled to an output port of a separate two-to-one digital multiplexer having two input ports, and a control signal port, said two multiplexer input ports being coupled to one of said separate counter output ports, and each said separate rate multiplexer being adapted to respond to the first plurality of externally derived clock pulses; and
   a signal inverter coupling one of said two multiplexer input ports to said one counter output port.

2. The programmable length decimation filter of claim 1, wherein said accumulator includes a reset port; and
   further comprising a signal output rate select coupled to said counter, said rate select having a plurality of input ports, an output port and a control signal port, each of said rate select input ports being coupled to a separate counter output port, respectively; and
   wherein the reset port of said accumulator is coupled to the rate select output port and responsive thereto.

3. The programmable length decimation filter of claim 2, wherein r is 9.

4. The programmable length decimation filter of claim 2, and further comprising means responsive to said accumulator for normalizing the accumulator output signals.

5. The programmable length decimation filter of claim 4, wherein said normalizing means comprises a parallel-to-serial converter coupled to the accumulator output ports;
   said programmable length decimation filter further comprising a tapped delay line having an output port, said parallel-to-serial converter being coupled to said tapped delay line.

6. The programmable length decimation filter of claim 5, and further comprising a signal output rate select coupled to said counter, said rate select having a plurality of input ports, an output port and a control signal port, each of said rate select input ports being coupled to a separate counter output port, respectively; and
   wherein the output port of said tapped delay line is coupled to the rate select output port and responsive thereto.

7. The programmable length decimation filter of claim 4, and further comprising means responsive to said normalizing means for converting the normalized accumulator output signals to signed twos complement binary format.

8. The programmable length decimation filter of claim 4, and further comprising a microprocessor coupled to the accumulator output ports, said microprocessor including twos complement converting means and said normalizing means.

9. The programmable length decimation filter of claim 2, wherein said rate select comprises an (N+1) to 1 multiplexer, N being less than r.

10. The programmable length decimation filter of claim 9, wherein the modulator single bit stream is supplied to the third input port of each of said resolution filter AND gates through another AND gate having an input port coupled to a time delay responsive to the rate select output signal, the time delay duration being one clock cycle of the predetermined rate.

11. The programmable length decimation filter of claim 10, including an additional signal inverter, said time delay being coupled to said another AND gate through said additional signal inverter.

12. The programmable length decimation filter of claim 10, wherein said time delay comprises a latch adapted to respond to externally derived clock pulses corresponding to the predetermined rate.

13. The programmable length decimation filter of claim 12, wherein said latch comprises a flip-flop.

14. A method for decimation filtering a stream of externally derived digital signals, said method comprising the steps of:

receiving said externally derived digital signal stream at a predetermined rate;

providing a predetermined resolution select signal, said resolution select signal being provided in thermometer code format;

generating a predetermined sequence of consecutive binary signals using an r bit binary counter having a plurality of output ports;

masking said received digital signal stream with said predetermined sequence of binary signals and said resolution select signal using a resolution filter comprising r logical AND gates, each of said AND grates having a first, a second, and a third input port and one output port, the input and output ports of said AND gates constituting the input and output ports of said resolution filter, respectively, the first input port of each AND gate being coupled to respond to the resolution select signal, the second input port of each AND gate being coupled to a separate counter output port, the third input port of each AND gate being coupled to respond to the received digital signal stream;

coupling said second input port of each of said filter gates to an output port of a separate two-to-one digital multiplexer having two input ports, and a control signal port, said two multiplexer input ports being coupled to one of said separate counter output ports, and each said separate multiplexer being responsive to a first plurality of externally derived clock pulses corresponding to the predetermined rate;

generating another predetermined sequence of consecutive binary signals by complementing the previously recited sequence of binary signals using a signal inverter for coupling one of said two multiplexer input ports to said one counter output port;

masking said received digital signal stream with said another predetermined sequence of binary signals and said resolution select signal using said resolution filter; and accumulating the masked signals using a 2r bit binary accumulator to provide a filtered signal, said accumulator being responsive to a second plurality of externally derived clock pulses corresponding to twice the rate of the first plurality of externally derived clock pulses.

15. The method of claim 14, wherein said stream of externally derived digital signals comprises a single bit signal stream from a one bit sigma-delta modulator.

16. The method of claim 15, and further comprising the step of masking the first binary signal of said predetermined sequence before the previously recited step of masking.

17. The method of claim 14, wherein the step of masking which precedes the coupling step comprises masking each of the digital signals in said stream with one of the binary signals, respectively, in said predetermined sequence and said resolution select signal.

* * * * *